(12) United States Patent
Klein

(10) Patent No.: US 6,306,768 B1
(45) Date of Patent: Oct. 23, 2001

(54) METHOD FOR PLANARIZING MICROELECTRONIC SUBSTRATES HAVING APERTURES

(75) Inventor: Rita J. Klein, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/441,923

(22) Filed: Nov. 17, 1999

(51) Int. Cl.$^7$ ................................................ H01L 21/00
(52) U.S. Cl. ............................ 438/693; 216/89; 438/745
(58) Field of Search ................................. 438/691, 692, 438/693, 745; 216/38, 88, 89; 156/345 LP

(56) References Cited

U.S. PATENT DOCUMENTS

| | | | |
|---|---|---|---|
| 5,270,241 | * 12/1993 | Dennison et al. | 438/692 X |
| 5,681,423 | * 10/1997 | Sandhu et al. | 438/692 X |
| 5,916,453 | * 6/1999 | Beilin et al. | 438/693 X |

FOREIGN PATENT DOCUMENTS

| | | |
|---|---|---|
| 838845 A1 | 4/1998 | (EP) . |
| WO 98/48453 | 10/1998 | (WO) . |

OTHER PUBLICATIONS

Cleaner Slurries, Fewer Wafer Defects; High Tech Separations News, v 11, n 4, p N/A; Sep. 1, 1998; ISSN: 1046–039X; Article.

Constance C. Knight; No Klebosol, No Chip; Clariant 2/99 Exactly your chemistry; Article.

Rodel Web Pages; Klebosol Slurries 1501–50 And 1508–50 CMP Colloidal Silica Slurries; Mar. 7, 2000.

\* cited by examiner

*Primary Examiner*—William A. Powell
(74) *Attorney, Agent, or Firm*—Perkins Coie LLP

(57) ABSTRACT

A method for planarizing a microelectronic substrate. In one embodiment, the microelectronic substrate includes an insulating portion having at least one aperture that is empty or at least partially filled with a sacrificial material. The method can include pressing a planarizing medium having small abrasive elements against the microelectronic substrate and moving at least one of the microelectronic substrate and the planarizing medium relative to the other to remove material from the microelectronic substrate. In one aspect of the invention, the abrasive elements can include fumed silica particles having a mean cross-sectional dimension of less than about 200 nanometers and/or colloidal particles having a mean cross-sectional dimension of less than about fifty nanometers. The smaller abrasive elements can reduce the formation of cracks or other defects in the insulating material during planarization to improve the reliability and performance of the microelectronic device.

64 Claims, 5 Drawing Sheets

METHOD FOR PLANARIZING MICROELECTRONIC SUBSTRATES HAVING APERTURES

TECHNICAL FIELD

This invention relates to methods for planarizing microelectronic substrates; for example, microelectronic substrates having dielectric portions with apertures that support devices such as capacitors.

BACKGROUND

Mechanical and chemical-mechanical planarization processes ("CMP") are used in the manufacturing of electronic devices for forming a flat surface on semiconductor wafers, field emission displays and many other microelectronic-device substrate assemblies. CMP processes generally remove material from a substrate assembly to create a highly planar surface at a precise elevation in the layers of material on the substrate assembly. FIG. 1 schematically illustrates an existing web-format planarizing machine 10 for planarizing a substrate 12. The planarizing machine 10 has a support table 14 with a top-panel 16 at a workstation where an operative portion (A) of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide rollers 22a and 22b, and take-up roller 23. The supply roller 20 carries an unused or pre-operative portion of the planarizing pad 40, and the take-up roller 23 carries a used or post-operative portion of the planarizing pad 40. Additionally, the first idler roller 21 a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. Accordingly, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing process. Several nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that translates along the gantry 34. The drive assembly 35 generally has an actuator 36, a drive shaft 37 coupled to the actuator 36, and an arm 38 projecting from the drive shaft 37. The arm 38 carries the substrate holder 32 via a terminal shaft 39 such that the drive assembly 35 orbits the substrate holder 32 about an axis B-B (as indicated by arrow $R_1$). The drive assembly 35 can also rotate the substrate holder 32 about its central axis C-C (as indicated by arrow $R_2$).

The planarizing pad 40 and the planarizing solution 44 define a planarizing medium that mechanically and/or chemically-mechanically removes material from the surface of the substrate 12. The planarizing pad 40 used in the web-format planarizing machine 10 is typically a fixed-abrasive planarizing pad in which abrasive particles are fixedly bonded to a suspension material. In fixed-abrasive applications, the planarizing solution is a "clean solution" without abrasive particles because the abrasive particles are fixedly distributed across the planarizing surface 42 of the planarizing pad 40. In other applications, the planarizing pad 40 may be a non-abrasive pad without abrasive particles, composed of a polymeric material (e.g., polyurethane) or other suitable materials. The planarizing solutions 44 used with the non-abrasive planarizing pads are typically CMP slurries with abrasive particles and chemicals to remove material from a substrate. Typical abrasive particles include ILD 1300 fumed silica particles, available from Rodel, Inc. of Wilmington, Del. and having a mean cross-sectional dimension of 200 nanometers, or Klebosol 1508-50 colloidal particles, also available from Rodel, Inc. and having a mean cross-sectional dimension of fifty nanometers.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then orbits the substrate holder 32 about the axis B-B and/or rotates the substrate holder 32 about the axis C-C to translate the substrate 12 across the planarizing surface 42. As a result, the abrasive particles and/or the chemicals in the planarizing medium remove material from the surface of the substrate 12.

The CMP processes should consistently and accurately produce a uniformly planar surface on the substrate assembly to enable precise fabrication of circuits and photo-patterns. During the fabrication of transistors, contacts, interconnects and other features, many substrate assemblies develop large "step heights" that create a highly topographic surface across the substrate assembly. Yet, as the density of integrated circuits increases, it is necessary to have a planar substrate surface at several intermediate processing stages because non-uniform substrate surfaces significantly increase the difficulty of forming sub-micron features. For example, it is difficult to accurately focus photo patterns to within tolerances approaching 0.1 micron on non-uniform substrate surfaces because sub-micron photolithographic equipment generally has a very limited depth of field. Thus, CMP processes are often used to transform a topographical substrate surface into a highly uniform, planar substrate surface.

During one conventional process, capacitors and other electrical components are formed in the microelectronic substrate 12 by first forming an aperture in the substrate 12 and then depositing successive layers of conductive and dielectric materials into the aperture. For example, FIG. 2A is a cross-sectional view of a portion of the substrate 12 shown in FIG. 1. The substrate 12 includes a base dielectric material 50 having two capacitor apertures 51. The walls of the capacitor apertures 51 are initially coated with a first conductive layer 60 that extends between the adjacent apertures. The substrate 12 is then planarized, using a process such as that discussed above with reference to FIG. 1, to remove intermediate portions 56 from between the capacitor apertures 51. Accordingly, the remaining portions of the conductive layer 60 within each capacitor aperture 51 are electrically isolated from each other.

As shown in FIG. 2B, a layer of dielectric material 61 is deposited on the remaining portions of the conductive layer 60 and on the exposed portions of the substrate upper surface 54. A second conductive layer 62 is deposited on the dielectric material 61 to form capacitors 70. An insulating material 63, such as borophosphate silicon glass (BPSG) is disposed on the second conductive layer 62 to fill the remaining space in the capacitor apertures 51 and electrically insulate the capacitors 70 from additional structures subsequently formed on the substrate 12. After the capacitors 70 are formed, a conductive plug aperture 52 is etched into the substrate 12 and filled with a conductive material to provide a conductive path between layers of the substrate 12.

One potential problem with the conventional method described above with reference to FIGS. 1–2B is that the base dielectric material 50 can crack during the planarization process. For example, the base dielectric material 50 typically includes an oxide or glass, such as silicon dioxide or BPSG, both of which are generally brittle. As the intermediate portions 56 are removed from between adjacent capacitor apertures 51, cracks 53 may form in the base dielectric material 50 between the adjacent capacitor apertures 51 at or beneath the substrate upper surface 54. Alternatively, the cracks 53 may extend from one or more of the capacitor apertures 51 to the conductive plug aperture 52. In either case, when the substrate 12 is heated during subsequent processing steps, the first conductive layer 60 may soften and flow through the cracks 53, potentially forming short circuits between neighboring capacitors 70 or between the capacitors 70 and the conductive plug formed in the plug aperture 52. These short circuits can substantially impair the performance of the resulting microelectronic device.

SUMMARY OF THE INVENTION

The present invention is directed toward methods for planarizing microelectronic substrates. One such method includes engaging a planarizing medium with a microelectronic substrate at least proximate to an insulating portion of the microelectronic substrate having an aperture that is empty or at least partially filled with a sacrificial material. The method can further include supplying the planarizing medium with relatively small abrasive elements. For example, the abrasive elements can include colloidal particles with a mean cross-sectional dimension of less than approximately fifty nanometers or fumed silica particles with a mean cross-sectional dimension of less than approximately 200 nanometers. The method can further include moving at least one of the microelectronic substrate and the planarizing medium relative to the other to remove material from the microelectronic substrate.

In one particular aspect of the invention, the microelectronic substrate can include a plurality of apertures, and capacitors can be formed in the apertures by successively disposing a first conductive layer, a dielectric layer, and a second conductive layer in the apertures. Accordingly, planarizing the microelectronic substrate can include planarizing the first conductive layer to electrically isolate portions of the first conductive layer within adjacent apertures from each other. In a further aspect of this embodiment, adjacent apertures are separated by a wall thickness of about 0.10 micron or less. The apertures can be filled with a non-structural, non-supporting material (such as a photoresistant gel) during planarization to restrict material from entering the apertures.

DETAILED DESCRIPTION OF THE INVENTION

The present disclosure describes methods for planarizing substrate assemblies used in the fabrication of microelectronic devices. Many specific details of certain embodiments of the invention are set forth in the following description and in FIGS. 3–7 to provide a thorough understanding of these embodiments. One skilled in the art, however, will understand that the present invention may have additional embodiments, and the invention may be practiced without several of the details described in the following description.

Figure 3:
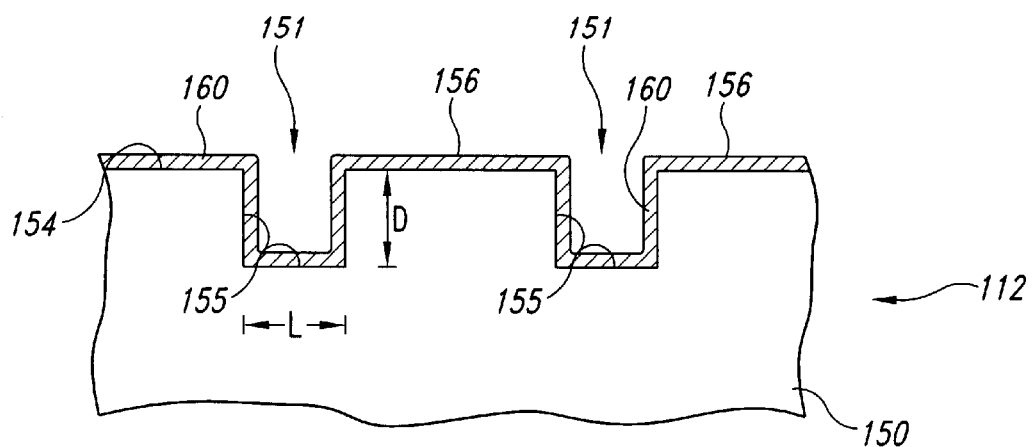
FIG. 3 is a partially schematic, side elevational view of a substrate having capacitor apertures for forming capacitors in accordance with an embodiment of the present invention.

FIG. 3 is a schematic cross-sectional view of a portion of a microelectronic substrate 112 that includes a base dielectric material 150 having a plurality of capacitor apertures 151 in which capacitors are formed. In one embodiment, the base dielectric material 150 can be a glass or glass-like material, such as silicon dioxide or BPSG. Alternatively, the base dielectric material 150 can be other insulating materials, such as tetraethyl-orthosilicate (TEOS), oxides or other doped or undoped insulating materials. Accordingly, the base dielectric material 150 can provide an electrically non-conductive support for capacitors and other electrical components or circuit elements.

In one embodiment, the capacitor apertures 151 can have a depth D of from about one micron to about three microns and in a specific aspect of this embodiment, the depth can be about 1.4 microns. In a further aspect of this embodiment, the capacitor apertures 151 can have a generally triangular or pear-shaped cross-sectional shape when intersected by a plane parallel to an upper surface 154 of the base dielectric material 150. For example, a short side of the triangular cross-sectional shape can have a length of about 0.25 micron or less and a long side L can have a length of about 0.30 micron or less. Alternatively, the capacitor apertures 151 can have other dimensions and shapes that can support the formation of capacitors in the manner discussed below.

As shown in FIG. 3, a first conductive material 160 is deposited on the microelectronic substrate 112 to form a layer that covers the upper surface 154 of the base dielectric material 150 and walls 155 of the capacitor apertures 151. In one embodiment, the first conductive material 160 includes polysilicon, such as hemispherical grain (HSG) polysilicon, doped with boron or phosphorus. Alternatively, the first conductive material 160 can include copper, platinum or other metals, metal alloys and/or non-metal conductive materials, such as ruthenium oxide. In either embodiment, the first conductive material 160 forms conductive connecting portions 156 extending between neighboring capacitor apertures 151. The connecting portions 156 are removed by a CMP process (as will be discussed in greater detail below with reference to FIG. 4) to electrically isolate the portions of the first conductive material 160 in each capacitor aperture 151.

Figure 1:
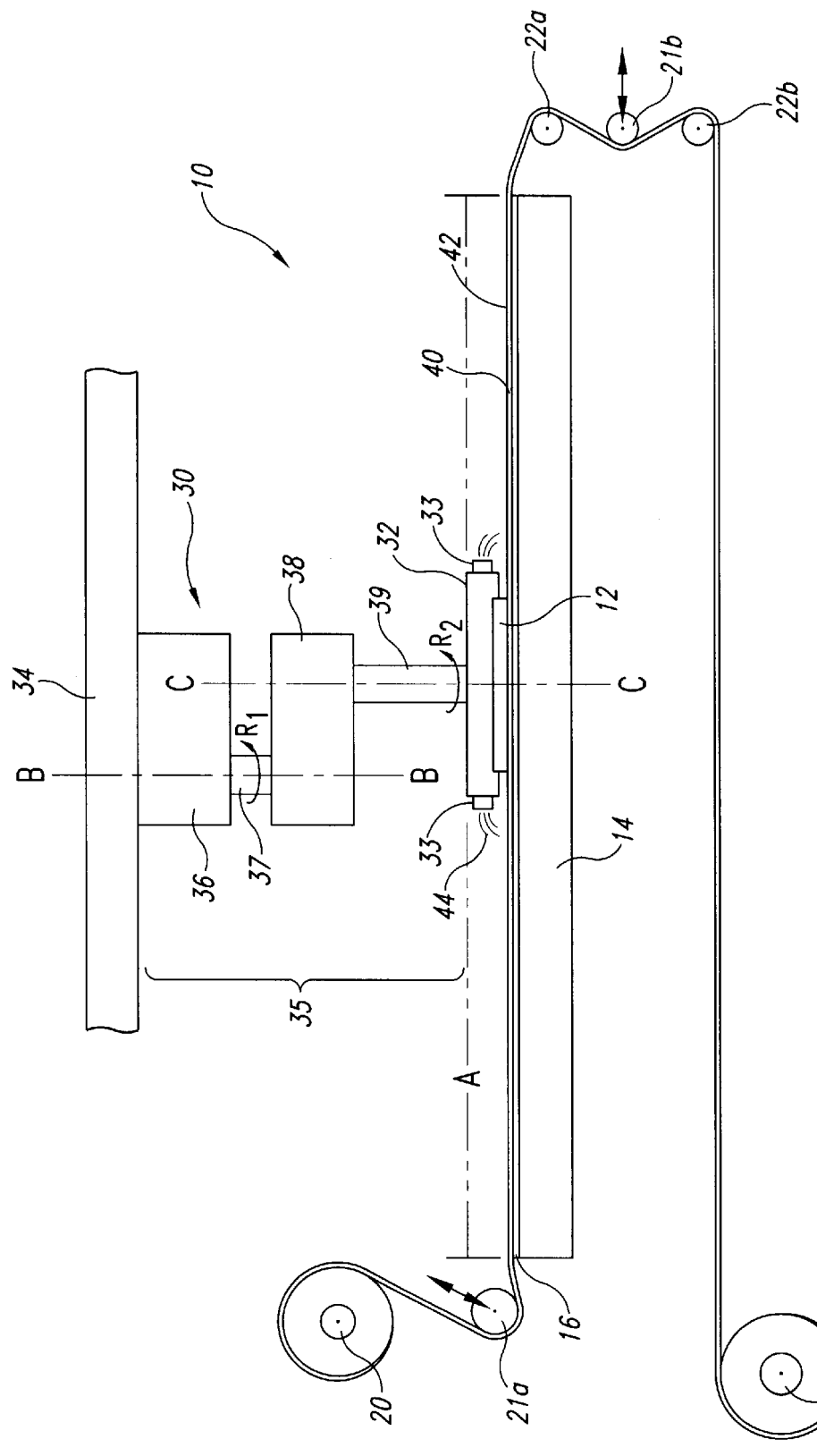
FIG. 1 is a partially schematic, side elevational view of a planarizing apparatus in accordance with the prior art.
Figure 2A:
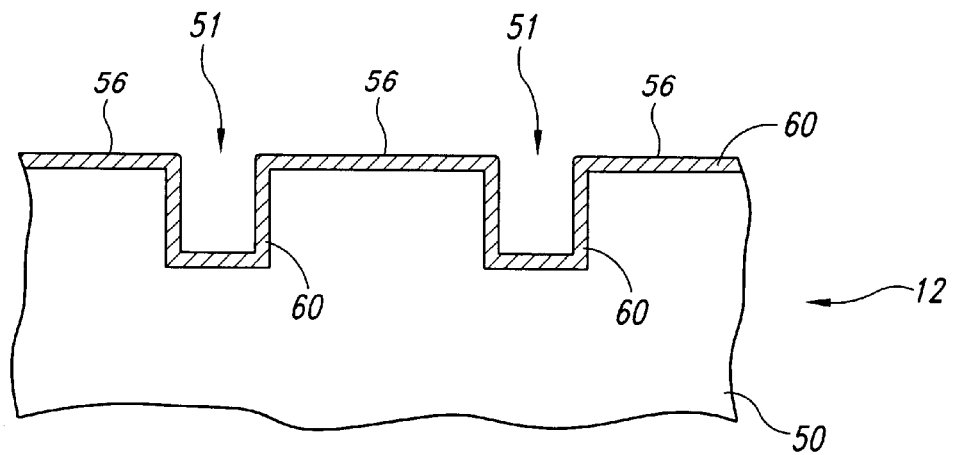
FIGS. 2A and 2B are partially schematic, side elevational views of a substrate having capacitors formed in a process in accordance with the prior art.
Figure 2B:
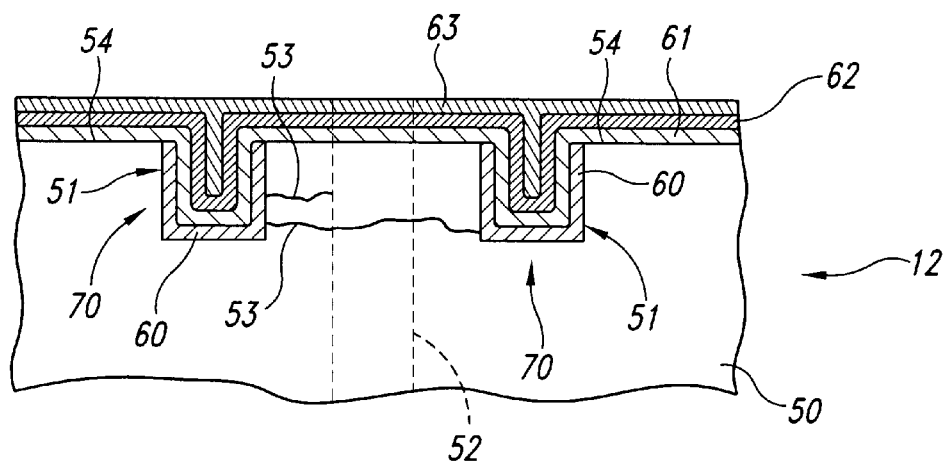
Figure 4:
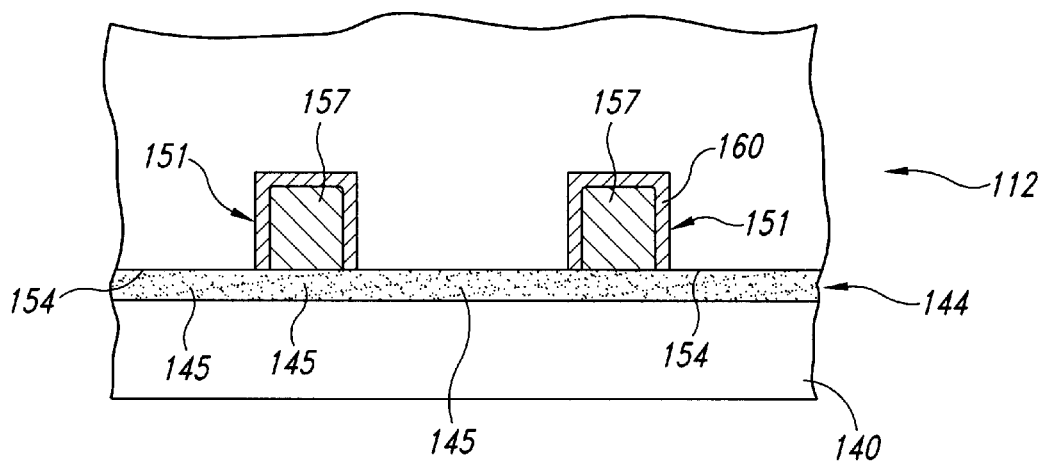
FIG. 4 is a partially schematic, side elevational view of the substrate shown in FIG. 3 undergoing a planarizing process in accordance with an embodiment of the invention.

FIG. 4 is a schematic, cross-sectional view of the portion of the microelectronic substrate 112 inverted from the orientation shown in FIG. 3 and placed against a planarizing medium that includes a planarizing pad 140 having a planarizing liquid 144 disposed thereon. The planarizing pad 140 can be a polyurethane-based pad, such as a URII or WWP3000 pad, available from Rodel, Inc. of Wilmington, Del. Alternatively, the planarizing pad 140 can include other suitable planarizing devices. The planarizing pad 140 can be positioned on a web-format machine, such as was discussed above with reference to FIG. 1, or other devices as will be discussed below with reference to FIG. 7.

Prior to planarizing the microelectronic substrate 112, the capacitor apertures 151 are filled with a sacrificial filler material 157 that restricts or prevents the planarizing liquid 144 and any material removed from the microelectronic substrate 112 from entering the capacitor apertures 151. In one embodiment, the filler material 157 is a fluid, flexible or pliable material that readily conforms to the shape of the capacitor apertures 151 and is relatively easy to remove after the planarizing process is complete. For example, the filler material 157 can be a commercially available photoresistant material in the form of a gel that can be removed with an etchant. In other embodiments, the filler material 157 can be other non-structural and/or non-rigid materials that similarly protect the capacitor apertures 151 from contamination during planarization and are removable after planarization.

During planarization, the planarizing liquid 144 is disposed on the planarizing pad 140, and the planarizing pad 140 and/or the microelectronic substrate 112 are moved relative to each other (in a manner generally similar to that discussed above with reference to FIG. 1). The planarizing liquid 144 and the planarizing pad 140 remove the connecting portions 156 (FIG. 3) positioned between the capacitor apertures 151 until the upper surface 154 of the base dielectric material 150 is exposed in the regions formerly covered by the connecting portions 156.

The planarizing liquid 144 generally includes a suspension of small abrasive particles 145 that engage the microelectronic substrate 112 during planarization to abrasively remove material from the microelectronic substrate 112. Alternatively, the planarizing pad 140 can include the abrasive particles, as will be discussed in greater detail below with reference to FIG. 7. In one embodiment, the abrasive particles 145 include generally rounded colloidal particles having a mean cross-sectional dimension of less than about fifty nanometers. In a further aspect of this embodiment, the abrasive particles can have a mean cross-sectional dimension of about twelve nanometers or less. Planarizing liquids having colloidal particles with a mean cross-sectional dimension of twelve nanometers are available from Solution Technology, Inc., a subsidiary of Rodel, Inc. of Wilmington, Del. under the trade name Klebosol 1508-12.

In another embodiment, the abrasive particles 145 can include more irregularly shaped funed silica particles having a mean cross-sectional dimension of less than about 200 nanometers. For example, the fumed silica particles can have a mean cross-sectional dimension of about 100 nanometers or less. Such abrasive particles are available from the Wacker Co. of Adrian, Mich. As used herein, the term "mean cross-sectional dimension" refers to the mean linear cross-sectional dimension of the average-sized abrasive particle 145 in the planarizing liquid 144. For example, when the abrasive particles 145 are generally round and uniformly sized, the mean cross-sectional dimension refers to the diameter of any of the abrasive particles. When the planarizing liquid 144 includes a distribution of abrasive particles 145 having irregular shapes and a variety of sizes, the mean cross-sectional dimension refers to the average linear cross-sectional dimension of the average particle in the distribution.

Figure 5:
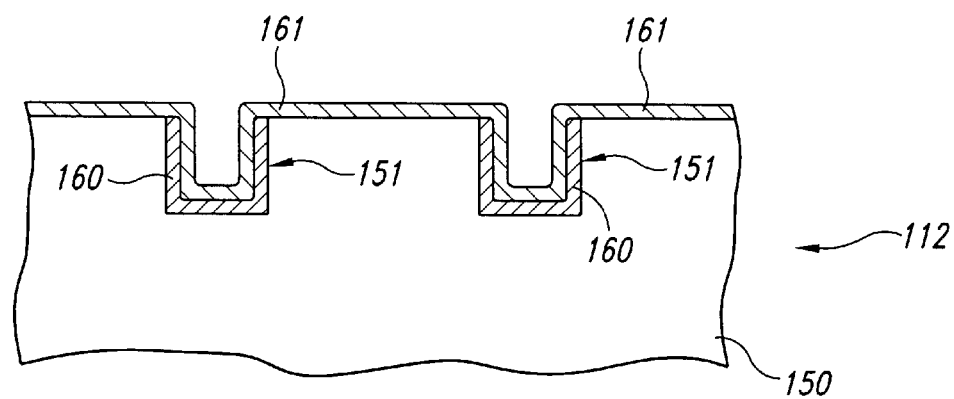
FIG. 5 is a partially schematic, side elevational view of the substrate shown in FIG. 4 having a dielectric layer deposited thereon.
Figure 6:
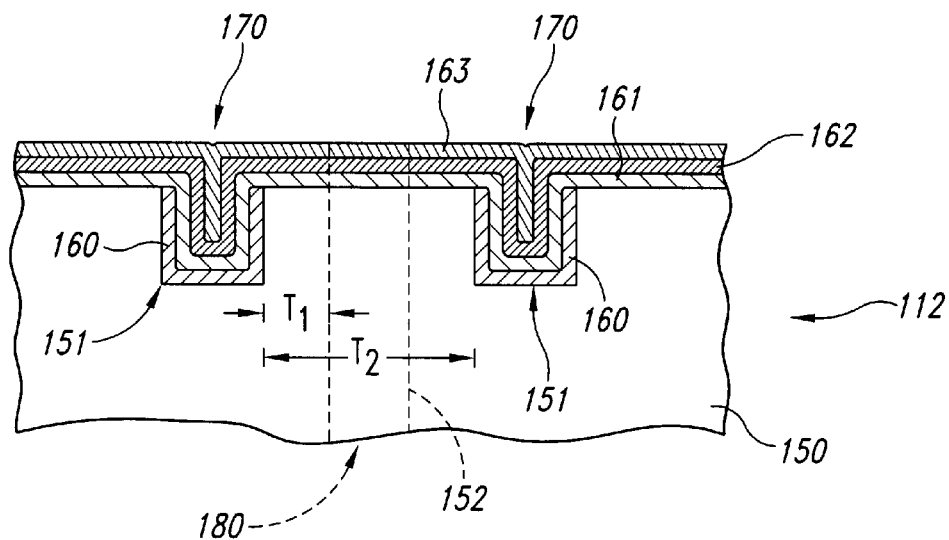
FIG. 6 is a partially schematic, side elevational view of the substrate shown in FIG. 5 having a conductive layer deposited on the dielectric layer.

FIG. 5 is a schematic cross-sectional view of the substrate assembly 112 after the connecting portions 156 have been removed. Once the planarization operation is complete, the filler material 157 (FIG. 4) is removed from the capacitor apertures 151 and the microelectronic substrate 112 is righted. A layer of dielectric material 161 is deposited on the microelectronic substrate 112 to cover the remaining portions of the first conductive material 160. The dielectric material 161 is then covered with a second conductive material 162, as shown in FIG. 6. The second conductive material 162, together with the first conductive material 160 and the dielectric material 161, form capacitors 170 in the capacitor apertures 151. An insulating material 163 is disposed on the second conductive material 162 to fill in the remaining volume of the capacitor apertures 151 and electrically isolate the capacitors 170 from conductive materials disposed on the microelectronic substrate 112 in subsequent operations.

After the capacitors 170 are formed, a plug aperture 152 is etched into the base dielectric material 150 and filled with a conductive material to provide a conductive plug 180 extending between components of the microelectronic substrate 112, for example, a transistor (not shown) positioned beneath the capacitors 170 and electrical contacts (not shown) positioned above the capacitors 170. In one aspect of this embodiment, the conductive plug aperture 152 is separated from the capacitor apertures 151 by a distance $T_1$, of about 0.14 micron or less, and adjacent capacitor apertures 151 are separated by a distance $T_2$ of about 0.15 micron or less. In another aspect of this embodiment, the distance $T_1$, can be about 0.10 micron or less and the distance $T_2$ can be about 0.125 micron or less. In still another aspect of this embodiment, six capacitor apertures 151 can be arranged in a ring around a single conductive plug aperture 152, with a diameter of the ring being about 0.4 micron. In other embodiments, the spacings between adjacent capacitor apertures 151 and/or between the capacitor apertures 151 and the conductive plug 180 can have other values that allow the apertures to be positioned closely together without causing the intermediate base dielectric material 150 to crack and to short-circuit the capacitors 170.

One feature of several embodiments of the abrasive particles 145 discussed above with reference to FIGS. 3–6 is that they are smaller than conventional abrasive particles used for planarizing microelectronic substrates having dielectric portions with apertures. For example, some conventional processes for planarizing such substrates include using fumed silica particles having a diameter of about 200 nanometers and larger or using colloidal particles having a diameter of about fifty nanometers and larger. An advantage of several embodiments of the abrasive particles 145 is that they are less likely to crack the base dielectric material 150 during planarization. Accordingly, planarizing with the abrasive particles 145 can reduce the likelihood for creating short circuits between neighboring capacitors 170, between the capacitors 170 and the conductive plug 180, and/or between the capacitors 170 and other conductive features of the microelectronic substrate 112. It is believed that the smaller abrasive particles 145 have a decreased tendency to crack the base dielectric material 150 because they exert less stress on the surface of the microelectronic substrate 112 during planarization than relatively larger particles.

Another effect of an embodiment of the smaller abrasive particles 145 is that they form a smoother surface on the microelectronic substrate 112 than larger conventional abrasive particles. The smoother surface can be advantageous because it can indicate that the base dielectric material 150 has fewer cracks. Accordingly, the quality of the microelectronic substrate 112 can be assessed without more invasive diagnostic techniques (such as cutting the microelectronic substrate 112 for visual examination), which can destroy the circuit elements of the microelectronic substrate 112. Furthermore, subsequent deposition and planarizing steps may be more accurately performed when the underlying planarized structure has a smoother supporting surface.

Figure 7:
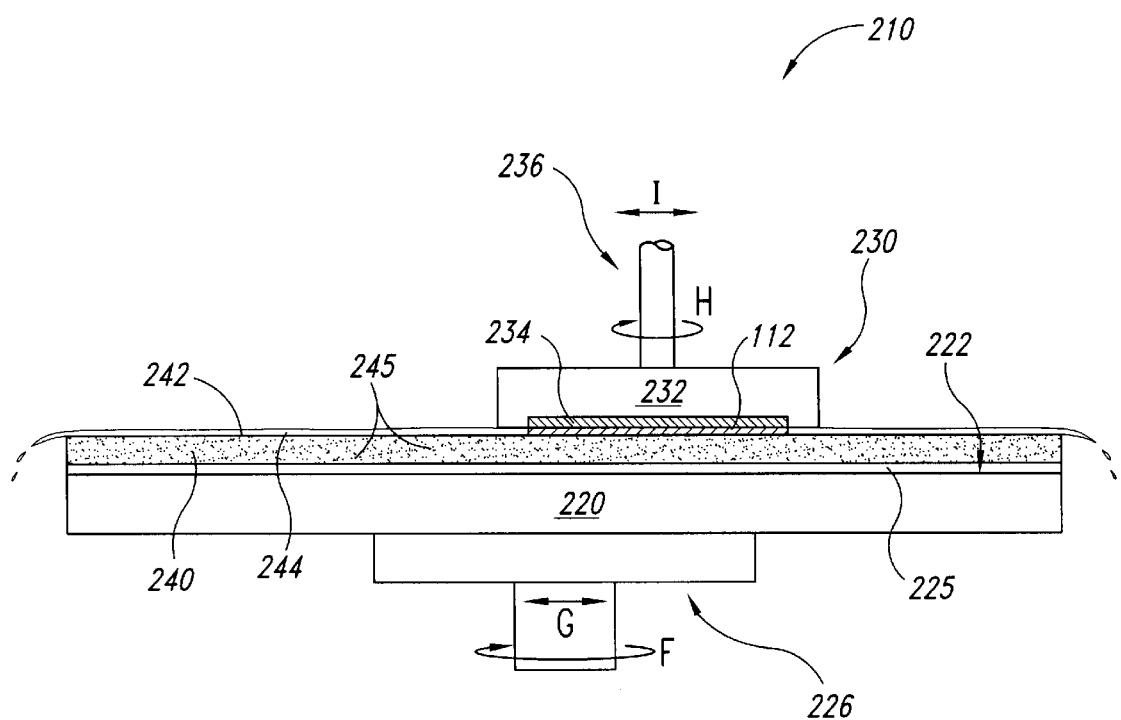
FIG. 7 is a partially schematic, side elevational view of an apparatus for planarizing a microelectronic substrate in accordance with another embodiment of the invention.

FIG. 7 is a schematic partial cross-sectional view of a rotary planarizing machine 210 with a generally circular platen or table 220, a carrier assembly 230, a planarizing pad 240 positioned on the table 220 and a planarizing fluid 244 on the planarizing pad 240. The planarizing machine 210 may also have an under-pad 225 attached to an upper surface 222 of the platen 220 for supporting the planarizing pad 240. A drive assembly 226 rotates (arrow F) and/or reciprocates (arrow G) the platen 220 to move the planarizing pad 240 during planarizing.

The carrier assembly 230 controls and protects the microelectronic substrate 112 during planarization. The carrier assembly 230 typically has a substrate holder 232 with a pad 234 that holds the microelectronic substrate 112 via suction. A drive assembly 236 of the carrier assembly 230 typically rotates and/or translates the substrate holder 232 (arrows H and I, respectively). Alternatively, the substrate holder 232 may include a weighted, free-floating disk (not shown) that slides over the planarizing pad 240.

The planarizing pad 240 can include abrasive particles 245 of the type discussed above with reference to FIGS. 3–6, fixedly dispersed in the planarizing pad adjacent to a planarizing surface 242 of the pad. To planarize the microelectronic substrate 112 with the planarizing machine 210, the carrier assembly 230 presses the microelectronic substrate 112 against the planarizing surface 242 of the planarizing pad 240. The platen 220 and/or the substrate holder 232 then move relative to one another to translate the microelectronic substrate 112 across the planarizing surface 242. As a result, the abrasive particles 245 in the planarizing pad 240 and/or the chemicals in the planarizing liquid 244 remove material from the surface of the microelectronic substrate 112.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for planarizing a microelectronic substrate, comprising:
   contacting a planarizing pad with a region of the microelectronic substrate having an insulating portion including at least one aperture that is empty or contains a sacrificial material;
   engaging abrasive elements with a mean cross-sectional dimension of less than approximately fifty nanometers with the microelectronic substrate at least proximate to the aperture; and
   moving at least one of the microelectronic substrate and the planarizing pad relative to the other to remove material from the microelectronic substrate.

2. The method of claim 1 wherein the aperture is a first aperture, further comprising:
   positioning a second aperture in the insulating portion of the microelectronic substrate with a wall thickness of about 0.15 micron or less between the first and second apertures before engaging the planarizing pad with the microelectronic substrate; and
   forming capacitors in the first and second apertures by disposing two conductive layers separated by a dielectric layer in each aperture.

3. The method of claim 2 wherein removing material from the microelectronic substrate includes removing an intermediate portion of one of the two conductive layers extending between the first and second apertures to electrically isolate a first portion of the one conductive layer in the first aperture from a second portion of the one conductive layer in the second aperture.

4. The method of claim 1, further comprising filling the aperture with a non-rigid, sacrificial material before engaging the microelectronic substrate with the planarizing pad to restrict planarizing fluid from entering the aperture.

5. The method of claim 4 wherein filling the aperture includes disposing a photoresist gel in the aperture.

6. The method of claim 1, wherein the aperture is a first aperture, further comprising:
   positioning a second aperture in the insulating portion of the microelectronic substrate with a wall thickness of less than about 0.14 micron between the first and second apertures after engaging the planarizing pad with the microelectronic substrate;
   forming a capacitor in the first aperture by disposing two conductive layers separated by a dielectric layer in the first aperture; and
   forming a conductive plug in the second aperture to transmit signals between layers of the microelectronic substrate.

7. The method of claim 1 wherein the aperture is configured to support a capacitor, further comprising disposing alternating layers of a conductive material and a dielectric material in the aperture to form the capacitor.

8. The method of claim 1 wherein engaging the abrasive elements with the microelectronic substrate includes pressing against the microelectronic substrate a plurality of colloidal abrasive elements having a mean cross-sectional dimension of approximately twelve nanometers.

9. The method of claim 1 wherein removing material from the microelectronic substrate includes removing a conductive material overlying the insulating portion of the microelectronic substrate adjacent to the aperture.

10. The method of claim 9, further comprising selecting the conductive material to include doped polysilicon.

11. The method of claim 9, further comprising selecting the conductive material to include platinum or another metal or metal alloy.

12. The method of claim 9, further comprising selecting the conductive material to include ruthenium oxide or another non-metal.

13. The method of claim 1 wherein removing material from the microelectronic substrate includes removing material from the insulating portion of the microelectronic substrate adjacent to the aperture.

14. The method of claim 1 wherein engaging the abrasive particles includes disposing the abrasive particles in a planarizing liquid and supplying the planarizing liquid to an interface between the planarizing pad and the microelectronic substrate.

15. The method of claim 1 wherein engaging the abrasive elements includes pressing against the microelectronic substrate abrasive elements fixedly distributed in the planarizing pad.

16. A method for planarizing a microelectronic substrate, comprising:
providing a microelectronic substrate having a dielectric portion with an aperture therein, the aperture being empty or containing a sacrificial material;
engaging a planarizing medium having abrasive elements, including fumed silica particles having a mean cross-sectional dimension of less than approximately 200 nanometers, or colloidal particles having a mean cross-sectional dimension of less than approximately fifty nanometers, or both, with the microelectronic substrate at least proximate to the dielectric portion and the aperture; and
moving at least one of the microelectronic substrate and the planarizing medium relative to the other to remove material from the microelectronic substrate.

17. The method of claim 16 wherein the planarizing medium includes a planarizing pad and a planarizing liquid disposed on the planarizing pad, further comprising filling the aperture with a non-rigid, sacrificial material before engaging the microelectronic substrate with the planarizing medium to restrict the planarizing liquid from entering the aperture.

18. The method of claim 17 wherein filling the aperture includes disposing a photoresist gel in the aperture.

19. The method of claim 16 wherein the aperture is configured to support a capacitor, and wherein the method further comprises disposing alternating layers of a conductive material and a dielectric material in the aperture to form the capacitor.

20. The method of claim 16 wherein engaging the planarizing medium with the microelectronic substrate includes engaging a plurality of colloidal abrasive particles having a mean cross-sectional dimension of approximately twelve nanometers with the microelectronic substrate.

21. The method of claim 16 wherein engaging the planarizing medium with the microelectronic substrate includes engaging a plurality of fumed silica abrasive particles having a mean cross-sectional dimension of approximately 100 nanometers with the microelectronic substrate.

22. The method of claim 16 wherein a layer of conductive material is disposed in and adjacent to the aperture and removing material from the microelectronic substrate includes removing the conductive material adjacent to the aperture to electrically isolate the conductive material in the aperture.

23. The method of claim 16 wherein the planarizing medium includes a planarizing pad and a planarizing liquid disposed on the planarizing pad, and wherein the method further comprises disposing the abrasive elements in at least one of the planarizing liquid and the planarizing pad.

24. A method for planarizing a microelectronic substrate, comprising:
pressing a microelectronic substrate having an oxide portion with an aperture that is empty or at least partially filled with a sacrificial material against a planarizing medium;
controlling a surface roughness of the oxide portion of the microelectronic substrate by disposing in the planarizing medium a plurality of abrasive elements having a mean cross-sectional dimension of less than approximately fifty nanometers and engaging the abrasive elements with the microelectronic substrate; and
moving at least one of the microelectronic substrate and the planarizing medium relative to the other to remove material from the microelectronic substrate.

25. The method of claim 24, further comprising:
filling the aperture with a non-rigid, sacrificial material before engaging the microelectronic substrate with the planarizing medium to restrict material from entering the aperture; and
removing the sacrificial material from the aperture after engaging the microelectronic substrate with the planarizing medium.

26. The method of claim 25 wherein filling the aperture includes disposing a photoresist gel in the aperture.

27. The method of claim 24 wherein the aperture is configured to support a capacitor, further comprising disposing alternating layers of a conductive material and a dielectric material in the aperture to form the capacitor.

28. The method of claim 24 wherein disposing a plurality of abrasive elements includes providing the planarizing medium with a plurality of colloidal particles having a mean cross-sectional dimension of approximately twelve nanometers.

29. The method of claim 24 wherein removing material from the microelectronic substrate includes removing a conductive material overlying the oxide portion of the microelectronic substrate adjacent to the aperture.

30. The method of claim 24 wherein removing material from the microelectronic substrate includes removing material from the oxide portion of the microelectronic substrate adjacent to the aperture.

31. A method for planarizing a microelectronic substrate, comprising:
providing a microelectronic substrate having an insulating portion with an aperture therein, the aperture being empty or containing a sacrificial material;
engaging a planarizing medium with the microelectronic substrate;
moving at least one of the planarizing medium and the microelectronic substrate relative to the other to remove material from the microelectronic substrate; and
controlling the formation of cracks in the insulating portion of the microelectronic substrate adjacent to the aperture by selecting a mean cross-sectional dimension of a plurality of abrasive elements in the planarizing medium to be at or below a selected value.

32. The method of claim 31 wherein the insulating portion has an interface surface adjacent to a conductive layer of the microelectronic substrate and an internal region adjacent to the interface surface, further wherein controlling the formation of cracks includes restricting the formation of cracks in the internal region of the insulating portion.

33. The method of claim 31, further comprising:
filling the aperture with a non-rigid, sacrificial material before engaging the microelectronic substrate with the planarizing medium to at least restrict material from entering the aperture; and
removing the sacrificial material from the aperture after engaging the planarizing medium with the microelectronic substrate.

34. The method of claim 33 wherein filling the aperture includes disposing a photoresist gel in the aperture.

35. The method of claim 31 wherein the aperture is configured to support a capacitor, further comprising disposing alternating layers of a conductive material and a dielectric material in the aperture to form the capacitor.

36. The method of claim 31 wherein selecting a mean cross-sectional dimension of a plurality of abrasive elements includes selecting the mean cross-sectional dimension of a plurality of colloidal particles to be approximately twelve nanometers.

37. The method of claim 31 wherein selecting a mean cross-sectional dimension of a plurality of abrasive elements includes selecting the mean cross-sectional dimension of a plurality of fumed silica particles to be about 100 nanometers.

38. The method of claim 31 wherein removing material from the microelectronic substrate includes removing a first portion of a conductive material overlying the insulating portion adjacent to the aperture to electrically isolate a second portion of the conductive material in the aperture.

39. The method of claim 31 wherein removing material from the microelectronic substrate includes removing material from the insulating portion of the microelectronic substrate adjacent to the aperture.

40. The method of claim 31 wherein the planarizing medium includes a planarizing pad supporting a planarizing liquid, and wherein the method further comprises disposing the abrasive elements in the planarizing liquid.

41. The method of claim 31 wherein the planarizing medium includes a planarizing pad supporting a planarizing liquid, and wherein the method further comprises fixedly disposing the abrasive elements in the planarizing pad.

42. A method for forming a capacitor in a microelectronic substrate, comprising:
    forming a capacitor aperture in an insulating material of the microelectronic substrate;
    disposing a first conductive material on the insulating material and on walls of the capacitor aperture;
    pressing at least one of a planarizing medium and the microelectronic substrate against the other;
    removing a portion of the first conductive material from the microelectronic substrate to expose the insulating material by moving at least one of the microelectronic substrate and the planarizing pad relative to the other;
    controlling the formation of cracks in the insulating material of the microelectronic substrate adjacent to the aperture by selecting the planarizing medium to include colloidal abrasive particles with a mean cross-sectional dimension of less than approximately fifty nanometers, or fumed silica particles having a mean cross-sectional dimension of less than approximately 200 nanometers, or both; and
    disposing a dielectric material and a second conductive material on the first conductive material in the capacitor aperture.

43. The method of claim 42 wherein forming the capacitor aperture includes forming an opening having a length along a first axis of approximately 0.30 micron or less and a width along a second axis transverse to the first axis of approximately 0.25 micron or less.

44. The method of claim 42 wherein the capacitor aperture is a first capacitor aperture, further comprising forming a second capacitor aperture in the insulating material spaced apart from the first capacitor aperture by a distance of approximately 0.15 micron or less.

45. The method of claim 42, further comprising forming a conductive plug aperture in the insulating material for supporting a conductive plug extending between layers of the microelectronic substrate, the conductive plug aperture being spaced apart from the capacitor aperture by a distance of approximately 0.14 micron or less.

46. The method of claim 42, further comprising:
    filling the capacitor aperture with a non-solid, sacrificial material before engaging the microelectronic substrate with the planarizing pad to at least restrict material from entering the aperture during planarization; and
    removing the sacrificial material after planarization.

47. The method of claim 46 wherein filling the capacitor aperture includes disposing a photoresist gel in the aperture.

48. The method of claim 42 further comprising selecting the planarizing medium to include a plurality of colloidal particles having a mean cross-sectional dimension of approximately twelve nanometers.

49. The method of claim 42 wherein the planarizing medium includes a planarizing pad and a planarizing liquid disposed on the planarizing pad and wherein the method further comprises disposing the colloidal abrasive elements and/or the fumed silica particles in the planarizing liquid.

50. A method for forming features in a microelectronic substrate, comprising:
    forming first and second apertures in an insulating portion of the microelectronic substrate with a distance between the apertures of about 0.15 micron or less;
    pressing a planarizing medium having abrasive elements with a mean cross-sectional dimension of less than about fifty nanometers against the microelectronic substrate proximate to the insulating portion while the apertures are empty or at least partially filled with a sacrificial material; and
    moving at least one of the microelectronic substrate and the planarizing medium relative to the other to remove material from the microelectronic substrate.

51. The method of claim 50, further comprising filling the apertures with a non-rigid, sacrificial material before engaging the microelectronic substrate with the planarizing pad to restrict material from entering the aperture; and removing the sacrificial material after planarizing the microelectronic substrate.

52. The method of claim 50 wherein filling the apertures includes disposing a photoresist gel in the apertures.

53. The method of claim 50 wherein the apertures are configured to support capacitors, further comprising disposing alternating layers of a conductive material and a dielectric material in the apertures to form the capacitors.

54. The method of claim 50, further comprising selecting the abrasive elements to include a plurality of colloidal abrasive particles having a mean cross-sectional dimension of approximately twelve nanometers.

55. The method of claim 50 wherein removing material from the microelectronic substrate includes removing a conductive material overlying the insulating portion of the microelectronic substrate.

56. The method of claim 50 wherein the planarizing medium includes a planarizing liquid disposed on a planarizing pad, and wherein the method further comprises disposing the abrasive elements in the planarizing liquid.

57. The method of claim 50 wherein the planarizing medium includes a planarizing liquid disposed on a planarizing pad, and wherein the method further comprises fixedly distributing the abrasive elements in the planarizing pad.

58. A method for forming features in a microelectronic substrate, comprising:
    forming first and second apertures in an insulating portion of the microelectronic substrate with a distance between the apertures of about 0.15 micron or less;
    pressing a planarizing medium having fumed silica abrasive particles with a mean cross-sectional dimension of less than about 200 nanometers against the microelectronic substrate proximate to the insulating portion while the first and second apertures are empty or at least partially filled with a sacrificial material; and moving at least one of the microelectronic substrate and the planarizing medium relative to the other to remove material from the microelectronic substrate.

59. The method of claim 58, further comprising selecting the fumed silica abrasive particles to have a mean cross-sectional dimension of about 100 nanometers.

60. The method of claim 58, further comprising filling the apertures with a non-rigid, sacrificial material before engaging the microelectronic substrate with the planarizing pad to restrict material from entering the aperture; and removing the sacrificial material after planarizing the microelectronic substrate.

61. The method of claim 60 wherein filling the apertures includes disposing a photoresist gel in the aperture.

62. The method of claim 58 wherein each aperture is configured to support a capacitor, further comprising disposing alternating layers of a conductive material and a dielectric material in each aperture to form the capacitors.

63. The method of claim 58 wherein removing material from the microelectronic substrate includes removing a conductive material overlying the insulating portion of the microelectronic substrate.

64. The method of claim 58 wherein the planarizing medium includes a planarizing liquid disposed on a planarizing pad, further comprising disposing the abrasive particles in the planarizing liquid.

* * * * *